United States Patent
Buh et al.

(10) Patent No.: US 7,351,622 B2
(45) Date of Patent: Apr. 1, 2008

(54) METHODS OF FORMING SEMICONDUCTOR DEVICE

(75) Inventors: Gyoung-Ho Buh, Suwon-si (KR); Chang-Woo Ryoo, Hwaseong-si (KR); Yu-Gyun Shin, Seongnam-si (KR); Tai-Su Park, Hwaseong-si (KR); Jin-Wook Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/490,613

(22) Filed: Jul. 21, 2006

(65) Prior Publication Data
US 2007/0020827 A1    Jan. 25, 2007

(30) Foreign Application Priority Data
Jul. 22, 2005    (KR)    .................. 10-2005-0066891

(51) Int. Cl.
H01L 21/84    (2006.01)
H01L 21/8234    (2006.01)
H01L 21/336    (2006.01)
H01L 21/00    (2006.01)

(52) U.S. Cl. .................. 438/157; 438/197; 438/268; 438/301; 438/306

(58) Field of Classification Search .................. 438/257, 438/795, 157, 197, 268, 301, 306
See application file for complete search history.

(56) References Cited

U.S. PATENT DOCUMENTS

| | | | |
|---|---|---|---|
| 6,465,287 B1 * | 10/2002 | Yamazaki et al. | 438/162 |
| 7,056,381 B1 * | 6/2006 | Yamazaki et al. | 117/85 |
| 7,094,670 B2 * | 8/2006 | Collins et al. | 438/513 |
| 2004/0110343 A1 | 6/2004 | Machida et al. | 438/257 |
| 2005/0017289 A1 * | 1/2005 | Kim et al. | 257/328 |
| 2005/0266645 A1 * | 12/2005 | Park | 438/282 |

FOREIGN PATENT DOCUMENTS

| | | |
|---|---|---|
| JP | 10-012890 | 1/1998 |
| JP | 2002-176003 | 6/2002 |
| JP | 2004-128208 | 4/2004 |
| KR | 2003-0061423 | 7/2003 |
| KR | 10-2004-0030329 | 4/2004 |

* cited by examiner

Primary Examiner—Akm Ullah
Assistant Examiner—Walter Swanson
(74) Attorney, Agent, or Firm—Mills & Onello LLP

(57) ABSTRACT

A method of forming a semiconductor device includes forming a three-dimensional structure formed of a semiconductor on a semiconductor substrate, and isotropically doping the three-dimensional structure by performing a plasma doping process using a first source gas and a second source gas. The first source gas includes n-type or p-type impurity elements, and the second source gas includes a dilution element regardless of the electrical characteristic of a doped region.

17 Claims, 14 Drawing Sheets

METHODS OF FORMING SEMICONDUCTOR DEVICE

CROSS-REFERENCE TO RELATED APPLICATION

This application claims priority under 35 U.S.C. § 119 to Korean Patent Application No. 10-2005-0066891 filed in the Korean Intellectual Property Office on Jul. 22, 2005, the contents of which are herein incorporated by reference in their entirety.

BACKGROUND OF THE INVENTION

1. Field of the Invention

The present invention relates to a method of forming a semiconductor device, and more particularly, to a method of forming a semiconductor device including a doping process.

2. Description of the Related Art

Generally, as a semiconductor device is more highly integrated, single elements constituting the semiconductor device (e.g., a field effect transistor (FET), a capacitor, an interconnection) are gradually scaled down in size. In particular, as the FET (hereinafter, referred to as a transistor in general) is scaled down, the driving current of the transistor decreases, which leads to a short channel effect or a drain induced barrier lowering (DIBL) effect. As a result, various characteristics of the semiconductor device may be degraded. For example, because the driving current amount decreases, the operational speed of the transistor may be lowered, and a margin that the memory device senses to identify data may be reduced. It is well known that transistor performance is degraded due to the short channel effect or the DIBL effect.

Recently, in order to address the problems of the transistor, a fin transistor has been proposed. The fin transistor employs a fin with a three-dimensional structure, which is protruded upward over a silicon substrate, as an active region. The fin transistor includes the fin, a gate electrode crossing over the fin, and a gate oxide layer interposed between the gate electrode and the gate oxide layer. Source/drain regions are formed on the fin disposed at both sides of the gate electrode.

A channel region of the fin transistor corresponds to the fin disposed under the gate electrode. That is, the channel region includes the top surface and both side surfaces of the fin under the gate electrode. This enables the driving current amount to increase because the width of the channel region increases in a restricted area. In addition, the gate electrode controls the channel region on both sides thereof to thereby enhance the controllability of the gate electrode with respect to the channel region. Therefore, it is possible to minimize the dergradation of the transistor characteristic by minimizing the short channel effect or the DIBL effect. The channel region of the fin transistor may be doped with n-type or p-type impurities in order to adjust the threshold voltage of the fin transistor. Typically, the impurities may be injected into the channel region of the fin transistor by an implantation process. In this implantation process, the impurity ions are anisotropically injected strongly as the projected range. As a result, the channel region of the fin transistor having the three-dimensional structure (hereinafter, referred to as a fin channel region) may be doped nonuniformly. In order to improve the doping uniformity for the fin channel region, the impurity ions may be injected by a tilted implantation. However, the impurity ions may be blocked by other adjacent fins or other structures, or the fin channel region may also be doped nonuniformly due to a restricted tilted angle. Accordingly, there is a problem that the nonuniform doping of the channel region causes the threshold voltage of the fin transistor to be varied, which results in degrading the characteristic of the fin transistor after all.

SUMMARY OF THE INVENTION

The present invention provides a method of forming a semiconductor device capable of uniformly doping n-type or p-type impurities into a three-dimensional structure which is formed of a semiconductor.

The present invention also provides a method of forming a semiconductor device capable of securing the reliability of the impurity concentration as well as uniformly doping low dose n-type or p-type impurities into a three-dimensional structure.

In one aspect, the present invention is directed to a method of forming a semiconductor device, the method including forming a three-dimensional structure formed of a semiconductor on a semiconductor substrate, and isotropically doping the three-dimensional structure by performing a plasma doping process using a first source gas and a second source gas. The first source gas includes n-type or p-type impurity elements, and the second source gas includes a dilution element regardless of the electrical characteristic of a doped region.

In one embodiment, the forming of the three-dimensional structure may include forming a fin protruded upward over the semiconductor substrate. In this case, the fin includes a channel region, and the fin is the three-dimensional structure.

In another embodiment, the forming of the three-dimensional structure may include: forming a fin protruded upward over the semiconductor substrate; forming a gate insulating layer on the surface of the fin; and forming a gate electrode on the gate insulating layer, the gate electrode crossing over the fin. Herein, the fin of both sides of the gate electrode corresponds to the three-dimensional structure.

In another embodiment, the forming of the three-dimensional structure may include forming a channel region including a concavity by recessing a predetermined region of the semiconductor substrate. The channel region including the concavity is the three-dimensional structure.

In another embodiment, the forming of the three-dimensional structure may include forming a channel region including at least one channel pattern spaced apart upwardly over the semiconductor substrate. Herein, the channel region corresponds to the three-dimensional structure. In this case, the plasma doping is performed such that impurities are doped through bottom and side surfaces of the channel pattern. The forming of the channel region may include the following process steps. A sacrificial layer and a channel layer are alternately formed over the semiconductor substrate at least once, wherein the sacrificial layer and the channel layer have different etch selectivity with respect to each other. The channel layer is formed of a semiconductor layer. The channel layer and the sacrificial layer are patterned in sequence to form a sacrificial pattern and a channel pattern which are alternately stacked at least one time. A pair of vertical patterns extended upward is formed over the semiconductor substrate, wherein one pair of opposite surfaces of the sacrificial and channel patterns contact the pair of vertical patterns, respectively, and the other pair of opposite surfaces of the sacrificial and channel patterns are exposed. Herein, the one pair of opposite side surfaces are perpendicular to the other pair of opposite side surfaces. The exposed sacrificial pattern is selectively removed.

In another embodiment, the forming of the three-dimensional structure may include: forming a channel region including at least one channel pattern spaced apart upwardly over the semiconductor substrate; and forming a vertical layer formed of a semiconductor over the semiconductor substrate such that the vertical layer surrounds the side surfaces of the channel patterns. Herein, the vertical layer is the three-dimensional structure, and the vertical layer includes source/drain regions.

In another embodiment, the isotropic doping by the plasma doping process may comprise: loading the semiconductor substrate having the three-dimensional structure into a process chamber; converting the first and second source gases into plasma state outside the process chamber; supplying the first and second source gases in plasma state into the process chamber; isotropically doping impurity ions and dilution ions of the first and second source gases in plasma state into the three-dimensional structure; and unloading the semiconductor substrate from the process chamber.

In another embodiment, the isotropic doping by the plasma doping process may comprise: loading the semiconductor substrate having the three-dimensional structure into a process chamber; supplying the first and second source gases into the process chamber; converting the first and second source gases into plasma state by applying a plasma energy to the process chamber; isotropically doping impurity ions and dilution ions of the first and source gases in plasma state into the three-dimensional structure; and unloading the semiconductor substrate from the process chamber.

In another embodiment, an ionization ratio of the second source gas may be equal to or higher than that of the first source gas. The amount of the dilution element may be greater than the amount of the impurity element. The dilution element may include at least one selected from the group consisting of oxygen, nitrogen, germanium, carbon, fluorine, and chlorine.

In another embodiment, the second source gas includes at least one of oxygen and nitrogen as the dilution element. The method may further include, after the plasma doping process: segregating the oxygen and/or nitrogen in the three-dimensional structure at the surface of the three-dimensional structure; and removing a segregated portion of the oxygen and/or nitrogen.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1A:
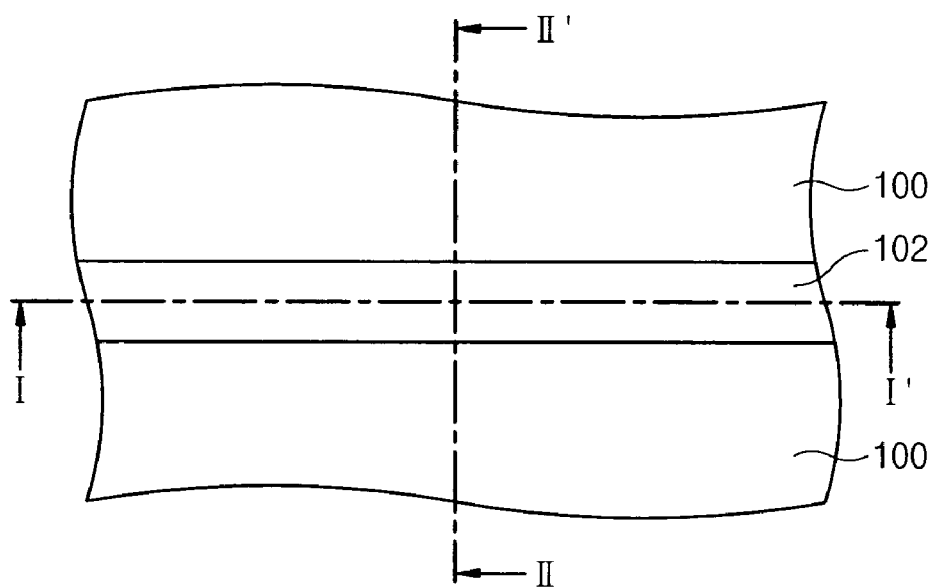
FIGS. 1A, 2A and 3A are plane views illustrating a method of forming a semiconductor device according to one embodiment of the present invention.

Reference will now be made in detail to the preferred embodiments of the present invention, examples of which are illustrated in the accompanying drawings. In the drawings, the thicknesses of layers (or films) and regions are exaggerated for clarity. It will also be understood that when a layer (or a film) is referred to as being "on" another layer (or another film) or substrate, it can be directly on the other layer (or the other film) or substrate, or intervening layers (or intervening films) may also be present.

First Embodiment

Figure 1B:
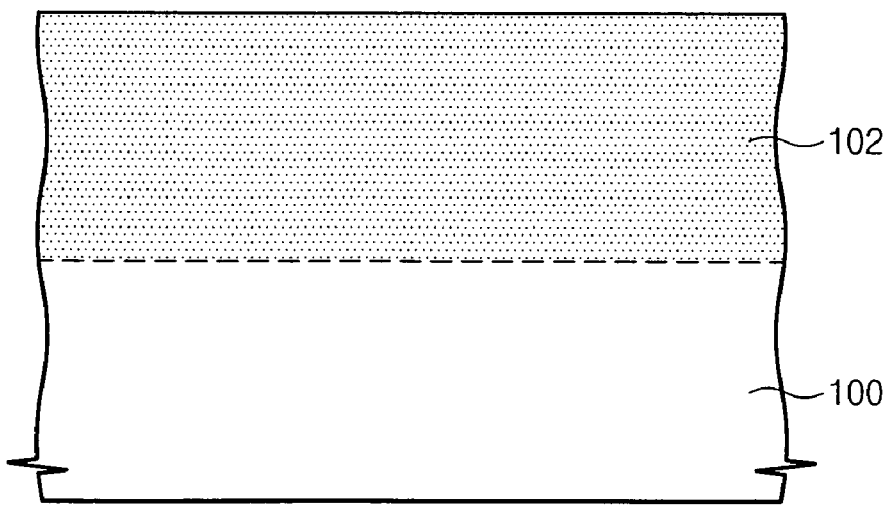
FIGS. 1B, 2B and 3B are cross-sectional views taken along the line I-I' of FIGS. 1A, 2A and 3A, respectively.
Figure 1C:
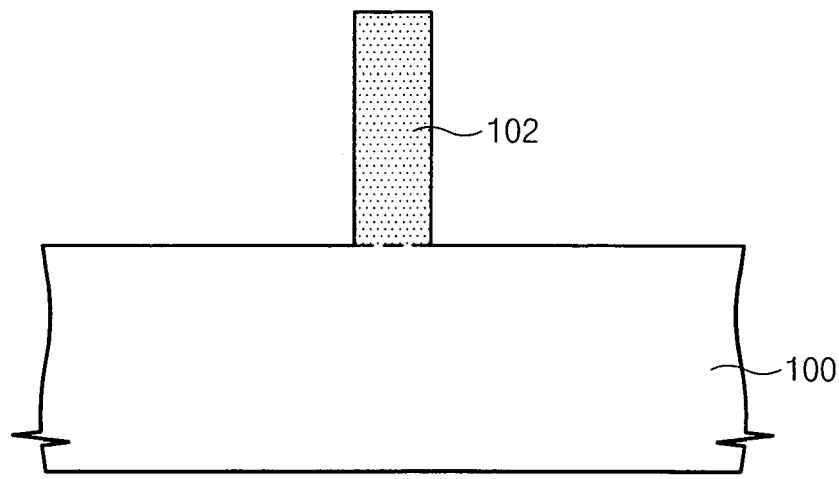
FIGS. 1C, 2C and 3C are cross-sectional views taken along the line II-II' of FIGS. 1A, 2A and 3A, respectively.
Figure 2A:
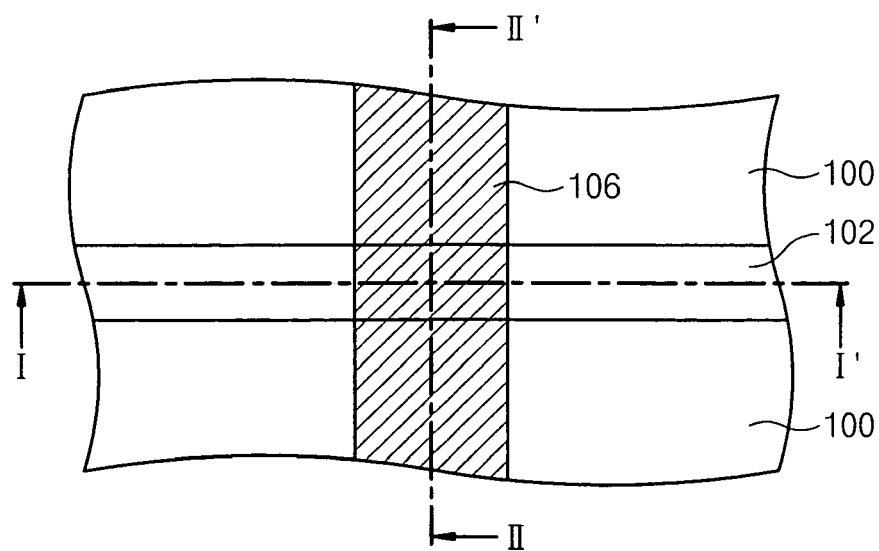
Figure 2B:
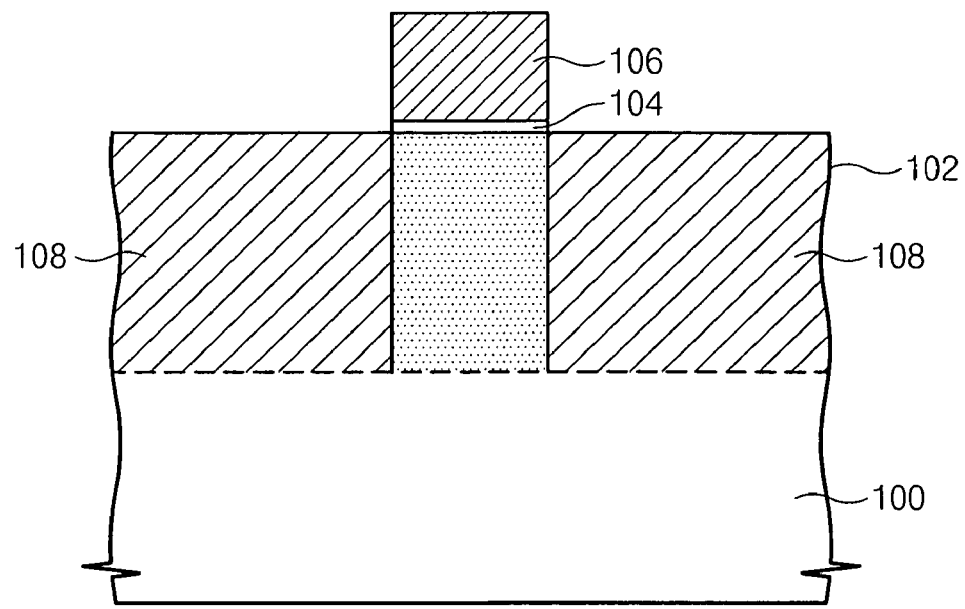
Figure 2C:
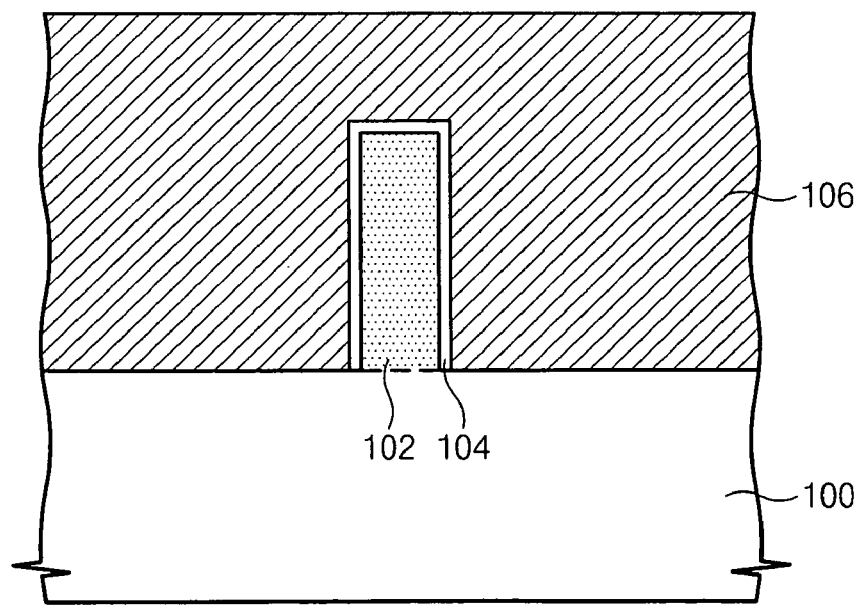
Figure 3A:
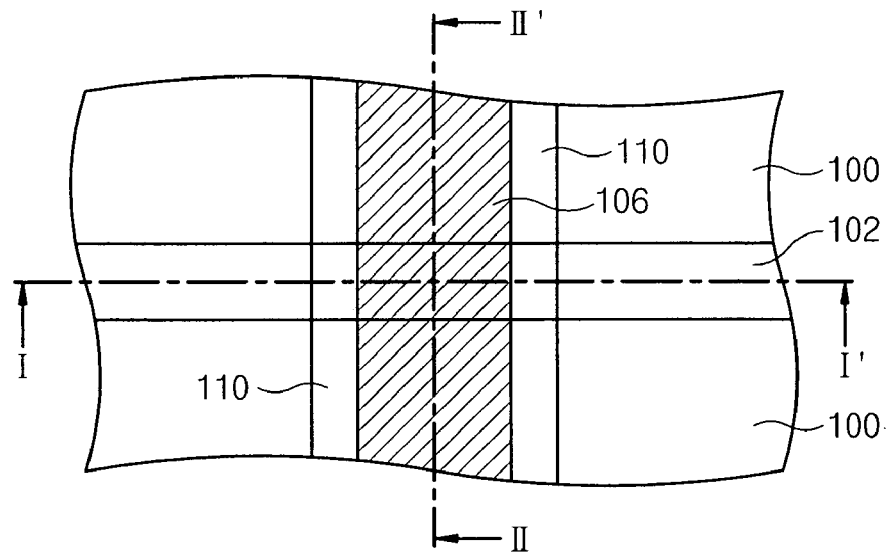
Figure 3B:
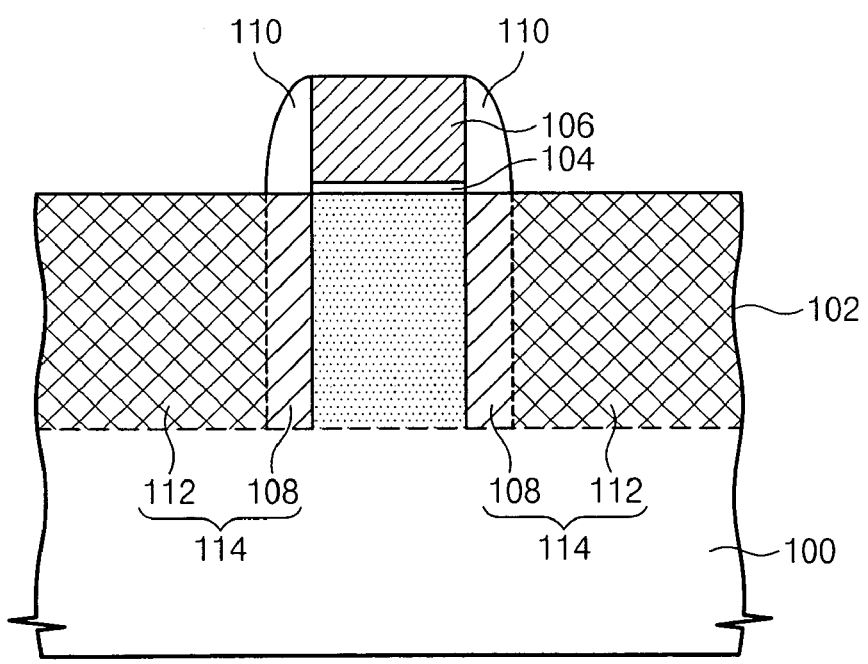
Figure 3C:
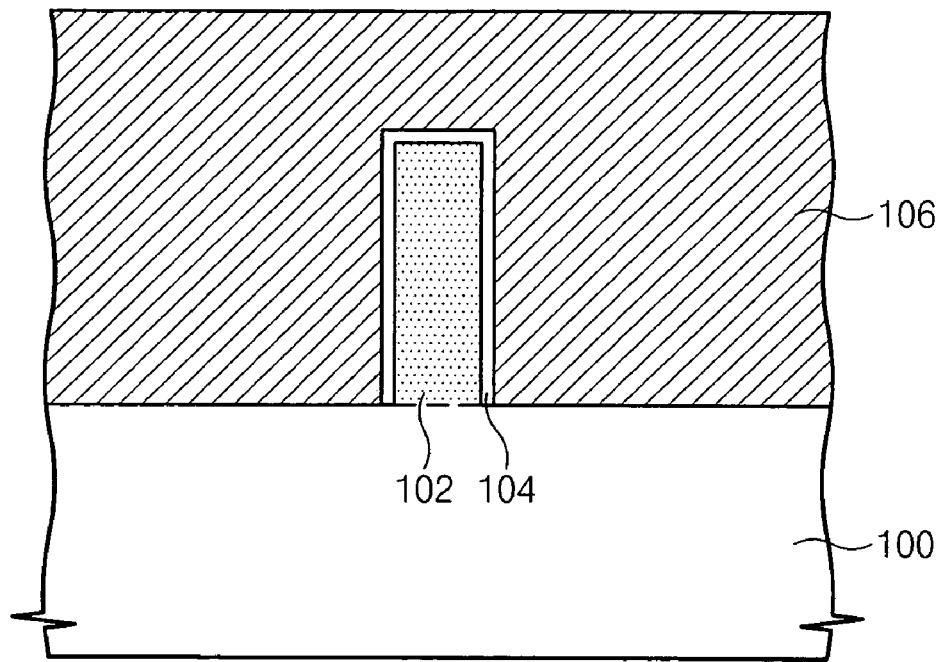

FIGS. 1A, 2A and 3A are plane views illustrating a method of forming a semiconductor device according to one embodiment of the present invention. FIGS. 1B, 2B and 3B are cross-sectional views taken along the line I-I' of FIGS. 1A, 2A and 3A, respectively. FIGS. 1C, 2C and 3C are cross-sectional views taken along the line II-II' of FIGS. 1A, 2A and 3A, respectively.

Referring to FIGS. 1A, 1B and 1C, a fin 102, which is protruded upwardly, is formed on a predetermined region of a semiconductor substrate 100. Herein, the fin 102 has a three-dimensional structure having a side surface and a top surface, wherein the fin 102 is formed of a semiconductor. For example, the fin 102 may be formed of single crystal silicon. The fin 102 may be formed by forming a mask pattern (not shown) on the semiconductor substrate 100 and subsequently etching the semiconductor substrate 100 using the mask pattern as an etch mask. That is, the fin 102 may be a portion of the semiconductor substrate 100. The fin 102 includes a channel region of a fin transistor.

The fin 102 may be formed by patterning the semiconductor substrate 100 doped with n-type or p-type impurities. Therefore, the fin 102 is also doped with the n-type or p-type impurities. If the fin transistor is an NMOS transistor, the fin 102 is doped with p-type impurities. On the contrary, if the fin transistor is a PMOS transistor, the fin 102 is doped with n-type impurities.

A first plasma doping process is performed on the fin 102 incorporating the channel region. The first plasma doping process is an impurity doping process for adjusting the threshold voltage of the fin transistor. The first plasma doping process will be more fully illustrated with reference to a flowchart of FIG. 11. The first plasma doping process illustrated in the flowchart of FIG. 11 may include all the plasma doping processes used in embodiments of the present invention. That is, the flowchart of FIG. 11 may be used for illustrating other plasma doping processes described in the embodiments of the present invention as well as the first plasma process.

Figure 11:
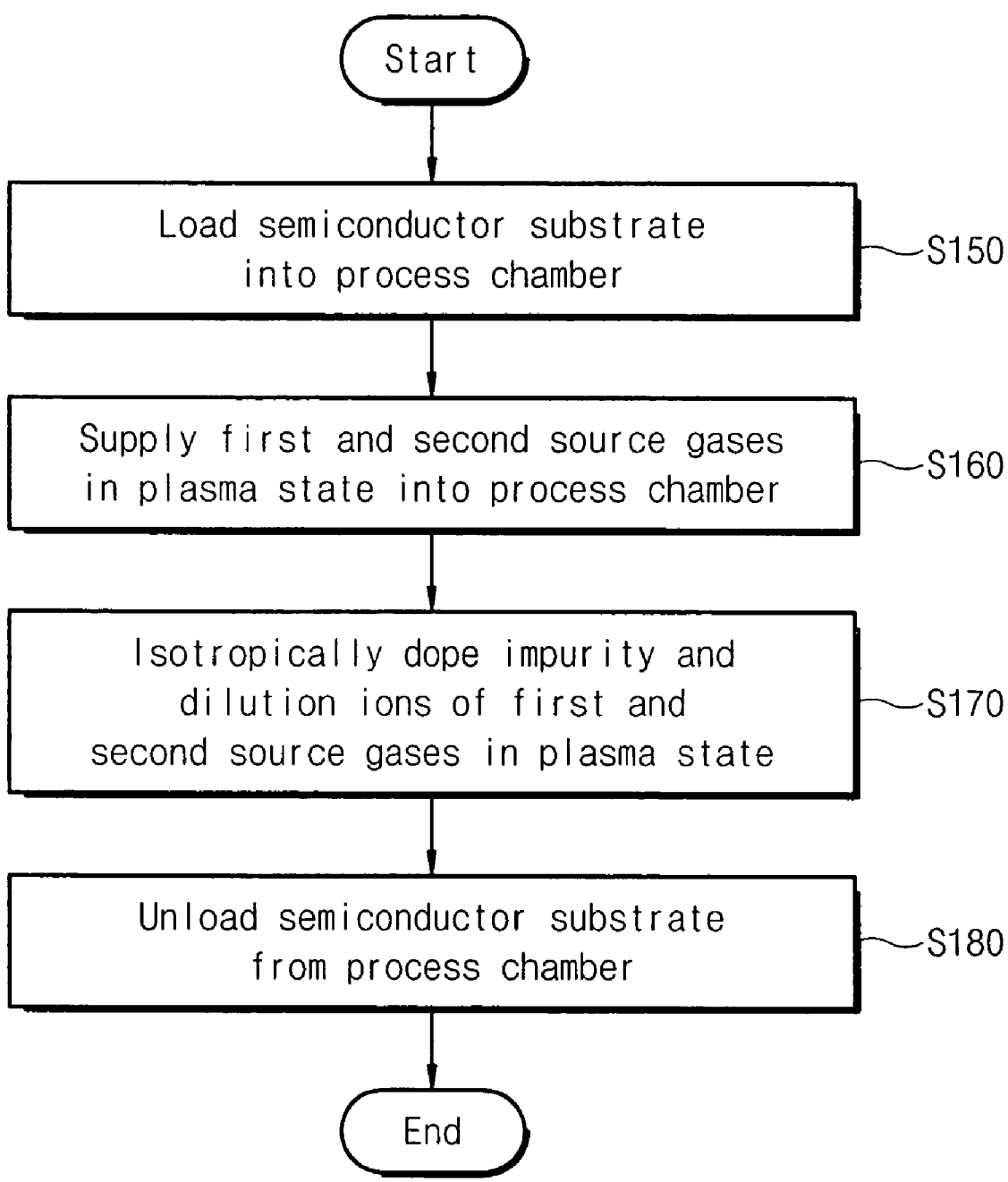
FIG. 11 is a flowchart illustrating a plasma doping process according to the embodiments of the present invention.

FIG. 11 is a flowchart illustrating a plasma doping process according to the embodiments of the present invention.

Referring to FIG. 1A, 1B, 1C and 11, the semiconductor substrate 100 having the fin 102 is loaded into a process chamber (S150). The semiconductor substrate 100 is loaded on a chuck arranged in the process chamber. Upon the surface of the fin 102, there may be formed a buffer oxide layer with a thin film thickness in a range of a few angstroms to tens of angstroms. The buffer oxide layer may perform a buffer function for protecting the fin 102 against damage.

Thereafter, first and second source gases are supplied into the process chamber (S160). The first source gas includes n-type or p-type impurity elements for adjusting the threshold voltage of the channel region. The second source gas includes dilution elements regardless of the electrical characteristic of a doped region. That is, the first source gas includes the n-type or p-type impurity elements which have an effect on the electrical characteristic of the doped region, and the second source gas includes the dilution elements which do not have an effect on the electrical characteristic of the doped region.

One method of supplying the first and second source gases in plasma state into the process chamber will be described. First, the first and second source gases are converted into the plasma state outside the process chamber. In this case, the first and second source gases may be converted into the plasma state using a process of irradiating a microwave on the first and second source gases. The microwave is correspondent to a plasma energy. Herein, the plasma energy may be defined as an energy required for converting the first and second source gas into the plasma state.

According to another method of supplying the first and second source gases in plasma state, the first and second source gases may be converted into the plasma state in the process chamber. In detail, the first and second source gases are supplied into the process chamber first and, thereafter, the first and second source gases are converted into the plasma state by applying the plasma energy to the process chamber. For instance, the plasma energy may be generated by applying radio frequency (RF) power to a coil-shaped plasma generation unit which is formed on an outer wall of the process chamber. Alternatively, the plasma energy may be generated by applying a predetermined power to an anode and a cathode which are spaced apart from each other in the process chamber.

It is preferable that the dilution element include at least one element selected from the group consisting of oxygen, nitrogen, silicon, germanium, carbon, and chloride. For example, the second source gas may include at least one selected from the group consisting of silicon hydride ($Si_xH_y$) gas, germanium hydride ($GeH_y$) gas, nitrogen ($N_2$) gas, oxygen ($O_2$) gas, chlorine ($Cl_2$) gas, fluorine ($F_2$) gas, carbon hydride ($C_xH_y$), and carbon dioxide ($CO_2$).

The first source gas may be a gas including an n-type impurity such as phosphorous (P) or arsenic (As). For instance, the first source gas may include at least one selected from the group consisting of arsenic hydride ($AsH_5$), arsenic trifluoride ($AsF_3$), and phosphine ($PH_3$). Alternatively, the first source gas may be a gas including a p-type impurity such as boron (B) or the like. For example, the first source gas may include at least one selected from the group consisting of boron trifluoride ($BF_3$), diborane ($B_2H_6$), etc.

Thereafter, the impurity ions and the dilution ions are isotropically doped into the fin 102 of the three-dimensional structure (S170). The impurity ions and the dilution ions are isotropically doped into the fin 102 by means of sheath electric field and/or scattering effect, wherein the sheath electric field is generated perpendicular to the surface of the fin 102. The intensity of the sheath electric field may be controlled by the amount of impurity and dilution ions. That is, as the amount of the impurity and dilution ions increases, the intensity of the sheath electric field increases. On the contrary, as the amount of the impurity and dilution ions decreases, the intensity of the sheath electric field decreases also. It is preferable that the sheath electric field should be high in order to isotropically inject the impurity and dilution ions into the fin 102 sufficiently. At this time, it is preferable to increase the sheath electric field by increasing the amount of the dilution ions. The amount of the impurity ions is determined by the characteristic of the transistor, e.g., threshold voltage or the like. Therefore, the amount of the impurity ions cannot exceed the amount of the impurity ions that the transistor requires. Since the dilution ions do not have an effect on the electric characteristic of the doped region, it is preferable to control the sheath electric field by adjusting the amount of the dilution ions.

In addition, it is possible to enhance the isotropic doping characteristic of the impurity and dilution ions by supplying thermal energy to the impurity and dilution ions.

The scattering effect will be set forth in detail. A back bias is applied to the chuck on which the semiconductor substrate 100 is loaded. Accordingly, the impurity and dilution ions move toward the chuck. At this time, the impurity and diffusion ions collide with each other so that they are scattered. The scattered impurity and dilution ions are injected into the fin 102 through the side surface thereof. Therefore, the impurity and dilution ions are isotropically doped into the fin 102. It is preferable that the amount of the impurity and dilution ions increases for increasing the amount of the scattered ions. In this case, it is preferable to increase the amount of the dilution ions. As described above, it is difficult to change the amount of the impurity ions because it is determined by the amount of the impurity ions that the transistor requires, whereas it is easy to control the amount of the dilution ions. Thus, it is preferable to control the scattering effect by adjusting the amount of the dilution ions. That is, it is preferable to increase the doping isotropy by increasing the amount of the dilution ions.

As described above, the impurity and dilution ions are isotropically doped into the fin 102 of the three-dimensional structure in virtue of the sheath electric field and/or the scattering effect. Accordingly, the impurity elements may be uniformly doped into the fin 102.

Furthermore, the intensity of the sheath electric field and the intensity of the scattering effect are controlled by adjusting the amount of the dilution ions. Accordingly, the impurity concentration of the channel region may satisfy a target concentration that the transistor requires, and further, the impurity ions may uniformly doped into the fin 102 as well.

The amount of the impurity and dilution ions doped into the fin 102 may be controlled by detecting the charges of the impurity and dilution ions. The dose of the impurity ions doped into the channel region may be very low. For example, the dose of the impurity ions is about $10^{12}/cm^2$. The charges of the low dose impurity ions are extremely small so that it is not easy to detect them. That is, since the detected charge is very low in case that the first plasma doping process is performed using only the first source gas, it may be difficult to control the doping concentration of the impurity.

However, the dilution ions as well as the low dose impurity ions are used in the first plasma doping process according to the present invention. Accordingly, it is detected that the charges of the injection ions are high because of the charges of the dilution ions. Resultingly, the reliability of the detected charge is improved so that it is very easy to dope low dose impurity ions. That is, it is possible to secure the reliability for the impurity concentration of the channel region.

In addition, the charge of the impurity ion (hereinafter, referred to as an impurity charge) is smaller than the detected total charge, because the total charge is a summation of the impurity ion charge and the dilution ion charge. Accordingly, the variation of the impurity charge is extremely small in comparison with the variation of the total charge. As a result, it is possible to minutely control the amount of the doped impurity element by minutely controlling the impurity charge. For instance, if the amount of the impurity charge is about 1% with respect to the total charge, the variation of the impurity charge becomes $10^{-8}$C in case that the variation of the total charge is $10^{-6}$C. That is, the ratio of the total charge variation to the impurity charge variation is 100 to 1. Therefore, the amount of the doped impurity element may be minutely controlled because the impurity charge can be minutely changed in comparison with the total charge variation. Resultingly, it is possible to improve the reliability for the impurity concentration of the doped region.

It is preferable that the amount of the dilution ions is greater than the amount of the impurity ions. Accordingly, the detected charge increases and the amount of the impurity ion may be minutely controlled as well. As a result, it is possible to enhance the reliability of the doped region requiring low dose impurities. For instance, the amount of the dilution ions may be a few times to thousands times greater than the amount of the impurity ions.

The first and second source gas in plasma state may include the impurity ions, impurity elements of radical component, electrons, the dilution ions, dilution elements of radical component, and electrons. It is preferable that the ionization ratio of the second source gas is equal to or higher than that of the first source gas.

Subsequently, with reference to the accompanying drawings, the doped semiconductor 100 is unloaded from the process chamber (S180). Accordingly, the first plasma doping process is completed.

Through the first plasma doping process, the threshold voltage of the NMOS transistor may decrease using the n-type impurity elements or the threshold voltage of the NMOS transistor may increase using the p-type impurity elements. On the contrary, the first plasma doping process may increase the threshold voltage of the PMOS transistor using the n-type impurity elements or may decrease the threshold voltage of the PMOS transistor using the p-type impurity elements.

If the second source gas includes carbon as the dilution element, the dilution elements are doped into the fin 102 and thus, the diffusion of the impurity element may be suppressed.

If the second source gas includes nitrogen and/or oxygen as the dilution element, the nitrogen and/or oxygen may be contained in the fin 102. The nitrogen and/or oxygen is coupled to semiconductor material such as silicon so as to degrade the characteristic of the fin transistor. To overcome such a problem, if the second source gas includes nitrogen and/or oxygen, it is preferable to perform a thermal process for making the nitrogen and/or oxygen contained in the fin 102 segregated at the surface of the fin 102 after the first plasma doping process. After the thermal process, there is performed a process of removing a segregation layer in which the nitrogen and/or oxygen is segregated. Therefore, it is possible to prevent the characteristic of the transistor from being degraded by minimizing the amount of the nitrogen and/or oxygen contained in the fin 102.

Referring to FIGS. 2A, 2B, and 2C, a gate insulting layer 104 is formed on the surface of the fin 102. The gate insulating layer 104 is formed on the top surface and both side surfaces of the fin 102. The gate insulating layer 104 may be formed of a thermal oxide layer. Before forming the gate insulating layer 104, a device isolation layer may be formed such that it surrounds a lower portion of the fin 102.

Thereafter, a gate conductive layer is formed on the gate insulating layer 104, and the gate conductive layer is patterned into a predetermined configuration to thereby form a gate electrode 106 crossing over the fin 102. The fin 102 disposed under the gate electrode 106 is correspondent to the channel region. The gate electrode 106 covers the top surface and both the side surfaces of the channel region. The gate conductive layer may be formed as a single layer or a multilayer formed of at least one selected from the group consisting of a doped polysilicon layer, a metal layer (e.g., a tungsten layer, a molybdenum layer, etc), a conductive metal nitride layer (e.g., a titanium nitride layer, a tantalum nitride layer, etc), and a metal silicide layer (e.g., a tungsten silicide layer, a cobalt silicide layer, etc).

A second plasma doping process is performed on source/drain regions of the fin 102 disposed at both sides of the gate electrode 106 to thereby form a lightly doped impurity layer 108. The second plasma doping process is similar to the first plasma doping process. The second plasma doping process will be illustrated with reference to the flowchart of FIG. 11.

Referring to FIGS. 2A, 2B, 2C and 11, the semiconductor substrate 100 having the source/drain regions with the three-dimensional structure, i.e., the fin 102 at both sides of the gate electrode 106, is loaded into a process chamber (S150).

First and second source gases in plasma state are supplied into the process chamber (S160) in which the semiconductor substrate 100 having the source/drain regions is loaded. The first source gas of the second plasma doping process includes n-type or p-type impurity elements, and the second source gas of the second plasma doping process includes dilution elements regardless of the electrical characteristic of the doped region. If the fin transistor is an NMOS transistor, the first source gas of the second plasma doping process may include at least one selected from the group consisting of arsenic hydride ($AsH_5$), arsenic trifluoride ($AsF_3$), and phosphine ($PH_3$). If the fin transistor is a PMOS transistor, the first source gas of the second plasma doping process may include at least one selected from the group consisting of boron trifluoride ($BF_3$), diborane ($B_2H_6$), etc. The dilution element of the second plasma doping process may be identical to the dilution element of the first plasma doping process. The second source gas of the second plasma doping process may be identical to the second source gas of the first plasma doping process.

In the second plasma doping process, a method of supplying the first and second source gases in plasma state into the process chamber may be the same as that of the first plasma doping process. That is, the first and second source gases of the second plasma doping process may be supplied into the process chamber after converting them into plasma state outside the process chamber. Alternatively, after the first and second source gases of the second plasma doping process are supplied into the process chamber, the source gases may be converted into the plasma state by applying plasma energy to the process chamber.

Thereafter, the impurity and dilution ions of the source gases in plasma state are isotropically doped into the source/drain region of the three-dimensional structure (S170). Through the second plasma doping process, the impurity and dilution ions are also isotropically doped into the source/drain region using the sheath electric field and/or scattering effect. Therefore, the impurity elements in the lightly doped impurity layer 108 may be uniformly doped. In the second plasma doping process, the intensity of the sheath electric field or the scattering effect is also controlled by adjusting the amount of the dilution ions, like the first plasma doping process. Accordingly, the impurity concentration of the lightly doped impurity layer 108 may satisfy a target concentration that the transistor requires, and the lightly doped impurity layer 108 may be uniformly doped as well.

Besides, the detected charge may increase by means of the dilution ions, and the amount of the impurity ions may be minutely controlled. As a result, the impurity concentration of the lightly doped impurity layer 108 may be controlled reliably. Also, in the second plasma doping process, it is preferable that the amount of the dilution ions is greater than the amount of the impurity ions. Therefore, it is possible to enhance the reliability for the impurity concentration of the lightly doped impurity layer 108.

After isotropically doping the impurity and dilution ions into the source/drain region (S170), the semiconductor substrate 110 is unloaded from the process chamber (S180). Therefore, the second plasma doping process is completed. It is preferable that the ionization ratio of the second source gas of the second plasma doping process is equal to or higher than that of the first source gas.

If the second source gas of the second plasma doping process includes nitrogen and/or oxygen as the dilution element, it is preferable to sequentially perform a thermal process for segregating the nitrogen and/or oxygen contained in the lightly doped impurity layer 108 at the surface of the fin 102, and a process of removing the segregation layer of the nitrogen and/or oxygen.

Referring to FIGS. 3A, 3B, and 3C, a spacer 110 is formed on both sidewalls of the gate electrode 106. The spacer 110 covers the top surface of a portion of the lightly doped impurity layer 108 and both side surfaces of the gate electrode 106.

Subsequently, a heavily doped impurity layer 112 is formed in the source/drain regions at one side of each spacer 110. Therefore, the lightly doped impurity layer 108 is disposed between the channel region and the heavily doped impurity layer 112.

The lightly and heavily doped layers 108 and 112 constitute source/drain 114 in shape of lightly doped drain (LDD). It is preferable that the heavily doped impurity layer 112 is formed through a third plasma doping process. In the third plasma doping process, the source/drain regions of the three-dimensional structure may also be isotropically doped using the sheath electric field and/or scattering effect. The third plasma doping process, like the first and second plasma doping processes, may also be performed in order of operations S150, S160, S170 and S180 illustrated in the flowchart of FIG. 11 using a first source gas having impurity ions and a second source gas having dilution ions. The first source gas of the third plasma doping process may include the impurity ion of which type is identical to that of the first source gas of the second plasma doping process. The dilution element of the third plasma doping process may be the same as the dilution elements of the first and second plasma doping processes. By controlling the amount of the dilution ions of the third plasma doping process, the intensity of the sheath electric field and/or the scattering effect may be controlled so that the heavily doped impurity layer 112 may be formed optimally.

Alternatively, the third plasma doping process may be performed using only the first source gas including the impurity elements. At this time, the impurity ions of the third plasma doping process may be doped heavily, wherein the dose of the impurity ions is about $10^{15}/cm^2$. That is, the dose of the impurity ions of the third plasma doping process may be thousands or more times greater than dose of the impurity ions of the first and second plasma doping processes. Thus, the amount of the impurity ions of the third plasma doping process is sufficient so that it is possible to secure the sheath electric field and/or the scattering effect enough to isotropically dope the impurity ions. As a result, the third plasma doping process may not need the source gas including the dilution elements of the first and second plasma doping processes.

Second Embodiment

The second embodiment provides a method of forming a transistor having a channel region of a three-dimensional structure which is different from the first embodiment.

Figure 4:
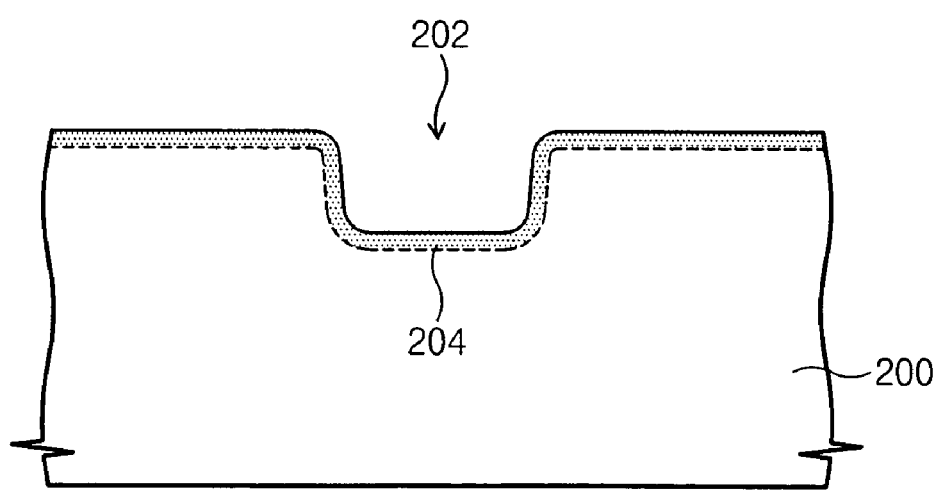
FIGS. 4 and 5 are cross-sectional views illustrating a method of forming a semiconductor device according to another embodiment of the present invention.
Figure 5:
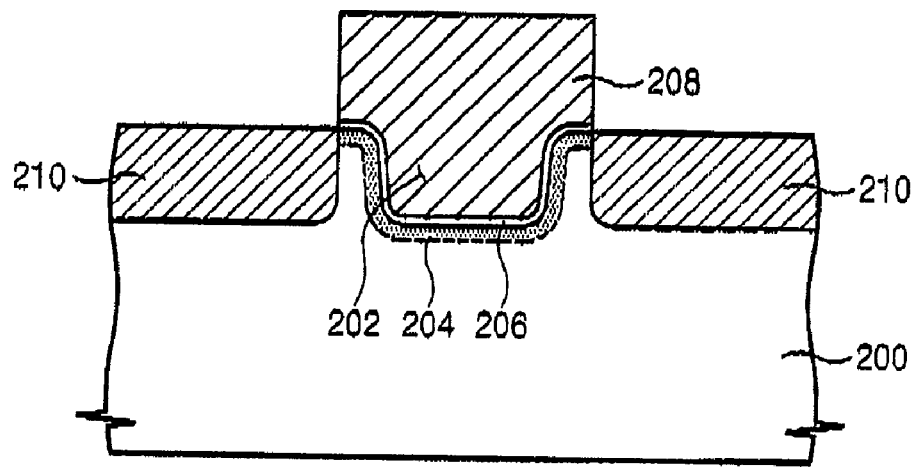

FIGS. 4 and 5 are cross-sectional views illustrating a method of forming a semiconductor device according to another embodiment of the present invention.

Referring to FIG. 4, a device isolation layer is formed in a semiconductor substrate 200 to define an active region. A predetermined region of the active region is recessed to form a concavity 202. The concavity 202 has a three-dimensional structure having a bottom surface and an inner surface. The concavity 202 incorporates the channel region of the transistor. The active region is doped with n-type or p-type impurity elements, and it may be formed by process of forming a well.

The plasma doping process is performed on the semiconductor substrate 200 having the concavity 202 to form a channel doping layer 204. The channel doping layer 204 is used for controlling the threshold voltage of the transistor. The plasma doping process is isotropically performed so that the channel doping layer 204 formed under the inside surface and bottom surface of the concavity 202 is uniformly doped with the impurities. The plasma doping process will be more fully illustrated with reference to the flowchart of FIG. 11.

Referring to FIGS. 4 and 11, the semiconductor substrate 200 having the concavity 202 of the three-dimensional structure is loaded into the process chamber (S150). The first and second source gases in plasma state are supplied into the process chamber (S160). The first source gas includes n-type or p-type impurity elements, and the second source gas includes dilution elements regardless of the electric characteristic of the channel doping layer 204. Like the first embodiment, the first source gas may be identical to the first source gas of the first plasma doping process. The kinds of the dilution element and second source gas may be identical to the kinds of the dilution element and second source gas of the first embodiment.

The first and second source gases are converted into plasma state outside the process chamber, and the first and second source gasses in plasma state may be supplied into the process chamber. Alternatively, after supplying the first and second source gases into the process chamber, the plasma energy is applied to the process chamber so that the first and second source gases may be converted into plasma state in the process chamber. In this case, the plasma energy is the same as that of the first embodiment.

The impurity and dilution ions in the first and second source gases in plasma state are isotropically doped into the surface of the concavity 202 (S170). The impurity and dilution ions isotropically are doped into the substrate 200 along the inside surface and bottom surface of the concavity 202 using the sheath electric field or/scattering effect as illustrated in the first embodiment. At this time, the sheath electric field and/or scattering effect may be controlled by adjusting the amount of the dilution ions. In particular, since the sheath electric field increases as the amount of the dilution ions increases, it is possible to improve the isotropic doping characteristic by intensifying the scattering effect. Therefore, the channel doping layer 204 formed under the inside surface and bottom surface of the concavity 202 of the three-dimensional structure is uniformly doped with the impurity and dilution ions. In addition, since the sheath electric field and/or scattering effect are controlled by the adjusting the amount of the dilution ions, the impurity concentration of the channel doping layer 204 satisfies the requiring concentration of the transistor and the channel doping layer 204 may be uniformly doped as well. Moreover, even though the dose of the impurity ions for forming the channel doping layer 204 is very low, the detected charge may increase by increasing the dose of the dilution ions, and further the amount of the impurity ions may be minutely controlled as well. Resultingly, it is possible to secure the reliability for the impurity concentration of the channel doping layer 204.

It is preferable that the amount of the dilution ions is greater than the amount of the impurity ions. For instance, the amount of the dilution ions may be a few times to thousands times greater than the amount of the impurity ions. Thus, the detected charge may increase and the minute controllability of the impurity ions may be enhanced. As a result, it is possible to improve the reliability for the impurity concentration of the channel doping layer 204. It is preferable that the ionization ratio of the second source gas is equal to or higher than that of the first source gas.

After completing the doping process (S170), the semiconductor substrate 200 is unloaded from the process chamber.

If the plasma doping process includes nitrogen and/or oxygen as the dilution element, it is preferable to sequentially perform a thermal process for segregating the nitrogen and/or oxygen at the surface of the semiconductor substrate 200 having the concavity 202, and a process of removing a segregation layer of the nitrogen and/or oxygen.

Referring to FIG. 5, it is possible to perform a process of making angular corners of the concavity 202 become round using a sacrificial thermal oxide layer, which prevents the electric field from being concentrated on the angular corners.

A gate insulating layer 206 is conformally formed on the active region, and a gate conductive layer is formed on the gate insulating layer 206 such that it fills the concavity 202. The gate conductive layer is patterned so as to form a gate electrode 208 which crosses over the active region, wherein the gate electrode 208 still fills the concavity 202. The active region under the gate electrode 208 is defined as the channel region, and the channel region includes the concavity 202. The gate insulating layer 206 may be formed of silicon oxide layer, e.g., particularly a thermal oxide layer. The gate conductive layer may be formed of the same material as the gate conductive layer of the first embodiment.

Thereafter, an impurity doped layer 210 is formed in the active region at both sides of the gate electrode 208. The impurity doped layer 210 may be formed by implanting the impurity ions through implant method. Alternatively, the impurity doped layer 210 may be formed by the plasma doping process of the present invention.

Third Embodiment

The third embodiment provides a method of forming a transistor having a channel region of a three-dimensional structure which is different from the previous embodiments.

FIGS. 6A, 7A, 8A, 9A and 10A are plane views illustrating a method of forming a semiconductor device according to another embodiment of the present invention. FIGS. 6B, 7B, 8B, 9B and 10B are cross-sectional views taken along the line III-III' of FIGS. 6A, 7A, 8A, 9A and 10A, respectively. FIGS. 6C, 7C, 8C, 9C and 10C are cross-sectional views taken along the line IV-IV' of FIGS. 6A, 7A, 8A, 9A and 10A, respectively.

Figure 6A:
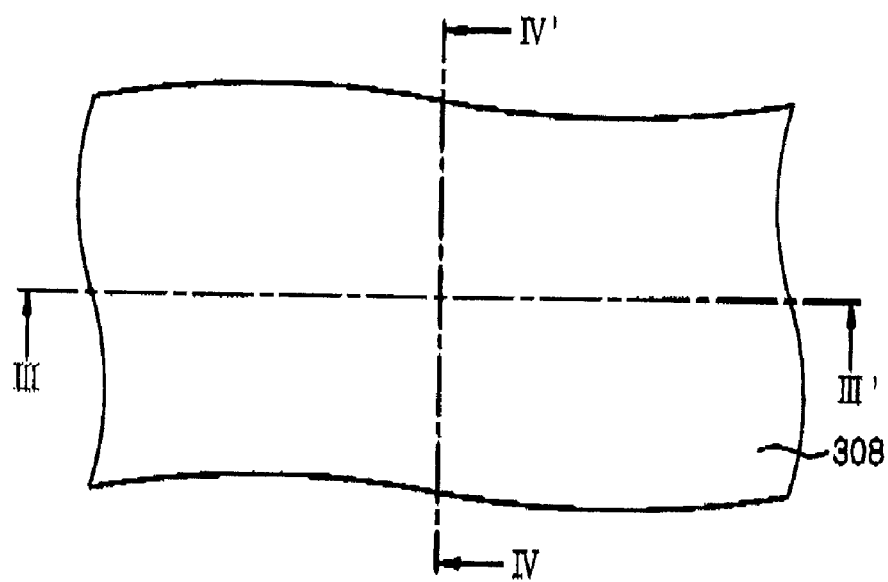
FIGS. 6A, 7A, 8A, 9A and 10A are plane views illustrating a method of forming a semiconductor device according to another embodiment of the present invention.
Figure 6B:
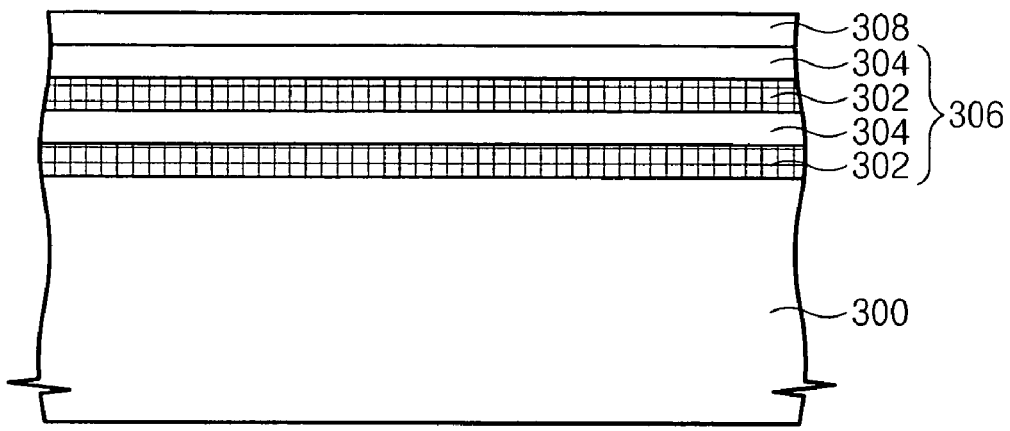
FIGS. 6B, 7B, 8B, 9B and 10B are cross-sectional views taken along the line III-III' of FIGS. 6A, 7A, 8A, 9A and 10A, respectively.
Figure 6C:
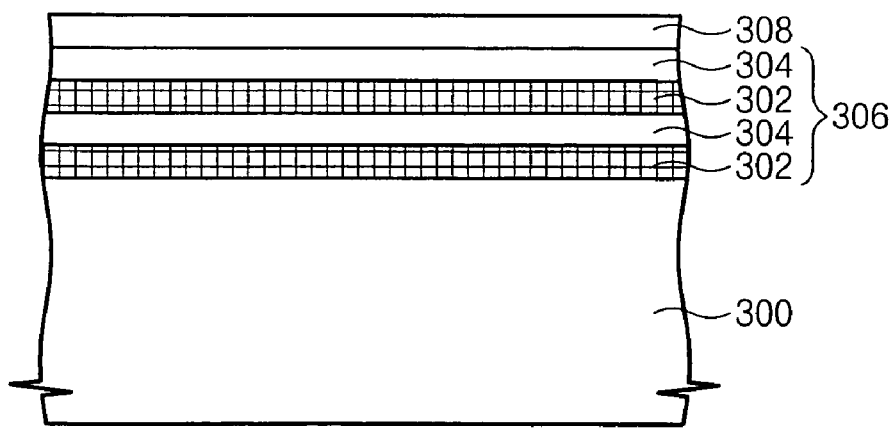
FIGS. 6C, 7C, 8C, 9C and 10C are cross-sectional views taken along the line IV-IV' of FIGS. 6A, 7A, 8A, 9A and 10A, respectively.

Referring to FIGS. 6A, 6B and 6C, a multilayer 306 is formed on a semiconductor substrate 300, wherein the multilayer 306 includes a sacrificial layer 302 and a channel layer 304 which are alternately stacked at least once. In the drawings, the sacrificial layer 302 and channel layer 304 are alternately stacked two times in the multilayer 306. The sacrificial layer 302 has an etch selectivity with respect to the channel layer 304. In addition, the sacrificial layer 302 is included in the channel region and thus, the channel layer 304 is formed of a semiconductor layer. For instance, the sacrificial layer 302 may be formed of a silicon germanium layer by epitaxial growth, and the channel layer 304 may be formed of a silicon layer by epitaxial growth. The silicon germanium layer and the silicon layer have different etch selectivity with respect to each other. Since the sacrificial layer 302 is formed by the epitaxial growth, it may be formed as a single crystal because of the semiconductor substrate 300. Likewise, since the channel layer 302 is formed by the epitaxial growth, it may be formed as a single crystal by virtue of the single crystal sacrificial layer 302.

A hard mask layer 308 may be formed on the multilayer 306. The hard mask layer 308 may include an insulating layer having an etch selectivity with respect to both the multilayer 306 and the semiconductor substrate 300. For example, the hard mask layer 308 may include a silicon oxide layer, a silicon nitride layer, or silicon oxynitride layer.

Figure 7A:
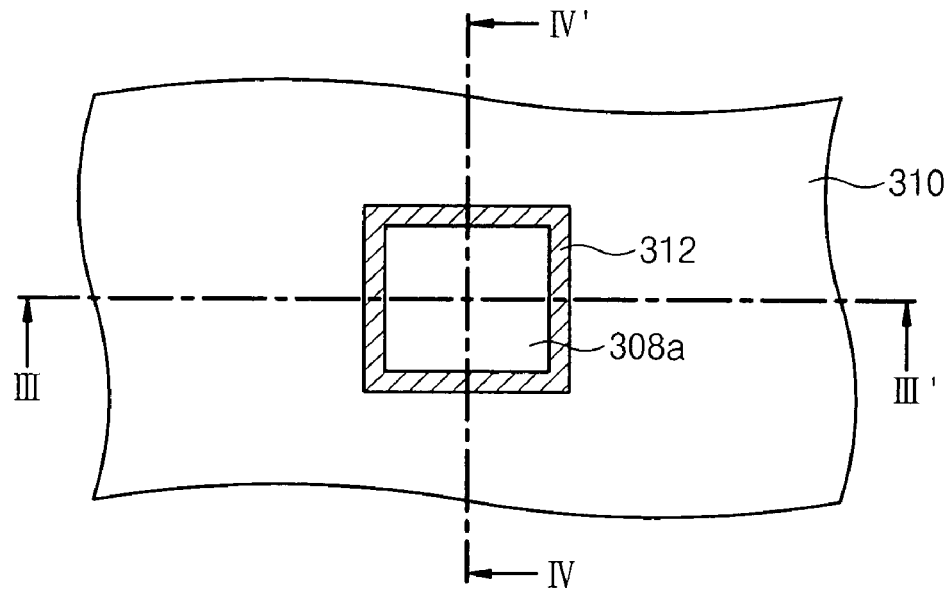
Figure 7B:
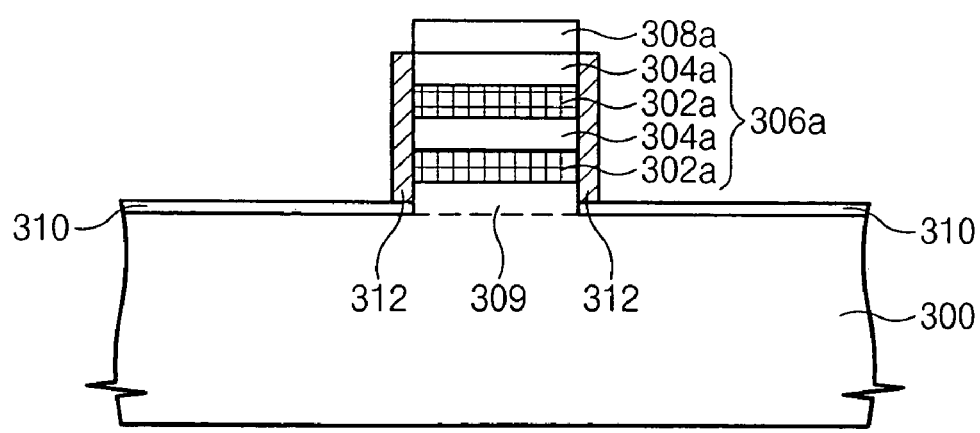
Figure 7C:
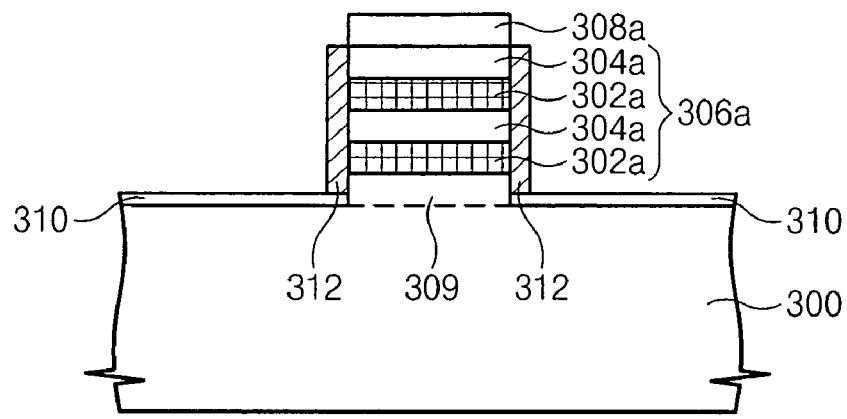

Referring to FIGS. 7A, 7B and 7C, the hard mask layer 308 and the multilayer 306 are patterned to form a multi layered pattern 306a and a hard mask pattern 308a stacked in sequence. In patterning process, the semiconductor substrate 300 is etched more so as to form a substrate protrusion 309 under the multi layered pattern 306a, wherein the substrate protrusion 309 is formed such that a portion of the semiconductor substrate 300 is protruded upward. The multi layered pattern 306a includes a sacrificial pattern 302a and a channel pattern 304a which are alternately stacked at least once. The multi layered pattern 306a includes a pair of first side surfaces opposite to each other, and a pair of second side surfaces opposite to each other, wherein the second side surfaces are perpendicular to the first side surfaces. Accordingly, each of the sacrificial and channel patterns 302a and 304a also include a pair of first side surfaces, and a pair of second side surfaces.

An insulating pattern 310 is formed on the semiconductor substrate 300 around the multi layered pattern 306a. The insulating pattern 310 may be formed in such a shape that it surrounds the sidewall of the substrate protrusion 309. The top surface of the insulating pattern 310 may be lower than the bottom surface of the lowermost pattern of the multi layered pattern 306a, i.e., the sacrificial pattern 302a. The insulating pattern 310 is formed by a predetermined method including: forming an insulating layer on the entire surface of the semiconductor substrate by CVD process; planarizing the insulating layer till the hard mask pattern 308a is exposed; and selectively recessing the planarized insulating layer.

Subsequently, a vertical layer 312 of the three-dimensional structure is formed on the semiconductor substrate 300. The vertical layer 312 is formed on the insulating pattern 310 and extended upwardly so that it surrounds the side surfaces of the multi layered pattern 306a. The vertical layer 312 is formed of the semiconductor layer. In particular, it is preferable that the vertical layer 312 is formed of the semiconductor layer having an etch selectivity with respect to the sacrificial pattern 302a. For instance, the vertical layer 312 may be formed of silicon layer by epitaxial growth. Accordingly, the vertical layer 312 may be formed of single crystal silicon on side surfaces of the sacrificial pattern 302a and the insulating pattern 304a, wherein the sacrificial pattern 302a and the insulating pattern 304a are formed of silicon germanium and silicon, respectively. The vertical layer 312 includes the source/drain region of the transistor.

The first plasma doping process is performed so that n-type or p-type impurity ions are isotropically doped into the vertical layer 312. The first plasma doping process is a process of doping the source/drain regions with the impurities. The first plasma doping process will be more fully illustrated with reference to the flowchart of FIG. 11.

Referring to FIGS. 7A, 7B, 7C and 11, the semiconductor substrate 300 having the vertical layer 312 is loaded into the semiconductor substrate 300 (S150), and the first and second source gases in plasma state are supplied into the process chamber (S160). The first source gas includes n-type or p-type impurity elements, and the second source gas includes dilution elements regardless of the electrical characteristic of the doped region. In case of NMOS transistor, the first source gas may include at least one selected from the group consisting of arsenic hydride ($AsH_5$), arsenic trifluoride ($AsF_3$), and phosphine ($PH_3$). In case of PMOS transistor, the first source gas may include a gas having a p-type impurity, e.g., at least one selected from the group consisting of boron trifluoride ($BF_3$), diborane ($B_2H_6$), etc. The dilution element and the second source gas of the first plasma doping process may be the same as those of the first and second embodiments. As illustrated in the aforementioned embodiments, the first and second source gases may be supplied into the process chamber after converting them into plasma state outside the process chamber. Alternately, after the first and second source gases are supplied into the process chamber, they may be converted into plasma state by means of the plasma energy applied to the process chamber.

The impurity and dilution ions of the first and second source gases in plasma state are isotropically doped into the vertical layer 312 (S170). At this time, the impurity and dilution ions are isotropically doped into the vertical layer 312 using the sheath electric field and/or the scattering effect, like the first and second embodiments. It is preferable that the intensity of the sheath electric field and/or the scattering effect should be controlled by adjusting the amount of the dilution ions. Thus, it is possible to uniformly distribute the impurities in the vertical layer 312 of the three-dimensional structure. In addition, the impurity concentration of the vertical layer 312 satisfies the target concentration, and the impurities may be uniformly distributed in the vertical layer 312 as well. Besides, the detected charge increase because of a lot of the dilution ions, and the amount of the impurity ions may be minutely controlled as well. Resultingly, it is possible to secure the reliability for the impurity concentration of the vertical layer 312.

The amount of the dilution ions may be greater than the amount of the impurity ions. The ionization ratio of the second source gas may be equal to or higher than that of the first source gas.

After completing the doping process (S170), the semiconductor substrate 300 is unloaded from the process chamber (S180).

If the first plasma doping process includes nitrogen and/or oxygen as the dilution element, it is preferable to sequentially perform a thermal process for segregating the nitrogen and/or oxygen at the surface of the vertical layer 312, and a process of removing a segregation layer of the nitrogen and/or oxygen.

Figure 8A:
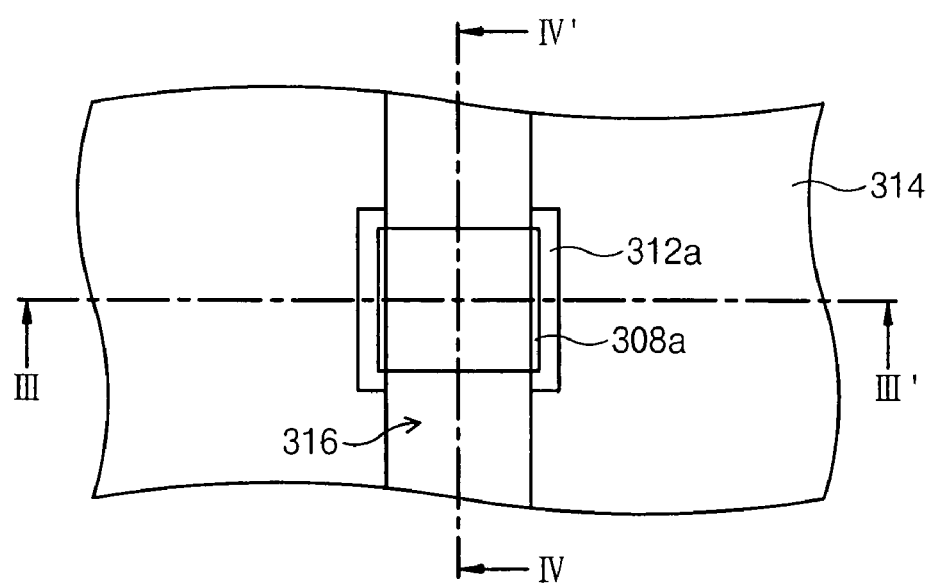
Figure 8B:
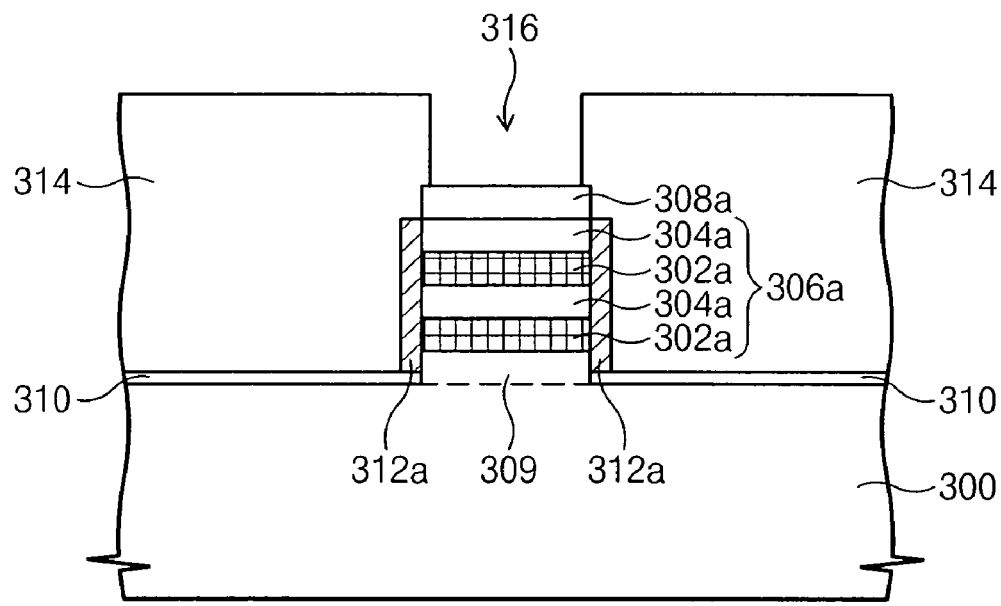
Figure 8C:
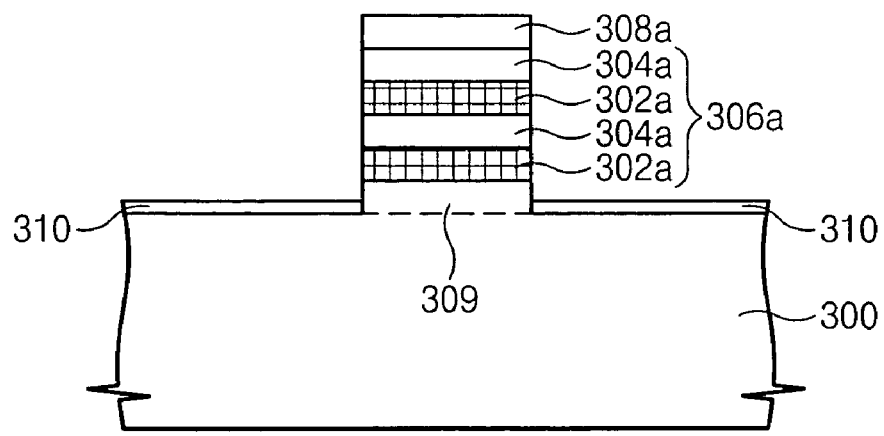

Referring to FIGS. 8A, 8B and 8C, a mold insulating layer 314 is formed such that it covers the entire surface of the semiconductor substrate 300. The mold insulating layer 314 is patterned to form a groove 316. The groove 316 exposes the top surface of the hard mask pattern 308a, and a portion of the vertical layer 312 formed on the first side surfaces of the multi layered pattern 306a.

The exposed portion of the vertical layer 312 is removed so as to expose the first side surfaces of the multi layered pattern 306a. That is, the first side surfaces of the sacrificial and channel patterns 302a and 304a are exposed. By removing the exposed portion of the vertical layer 312, a vertical pattern 312a is formed such that it is in contact with the second side surfaces of the multi layered pattern 306a, respectively. The vertical pattern 312a is correspondent to the source/drain regions.

Figure 9A:
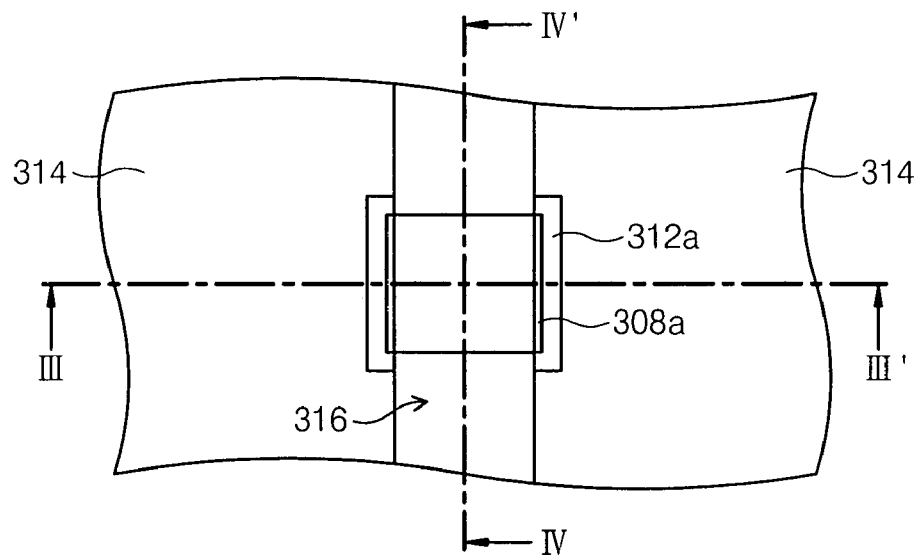
Figure 9B:
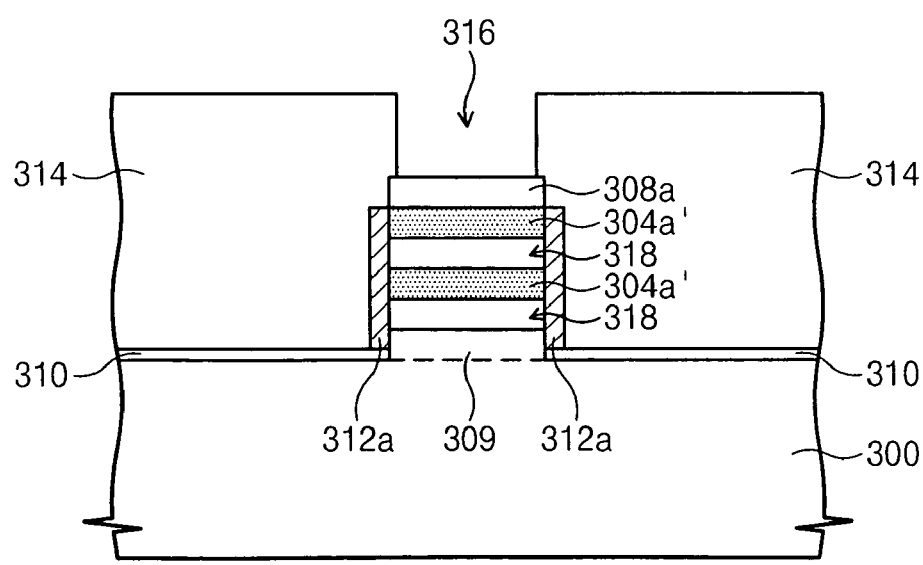
Figure 9C:
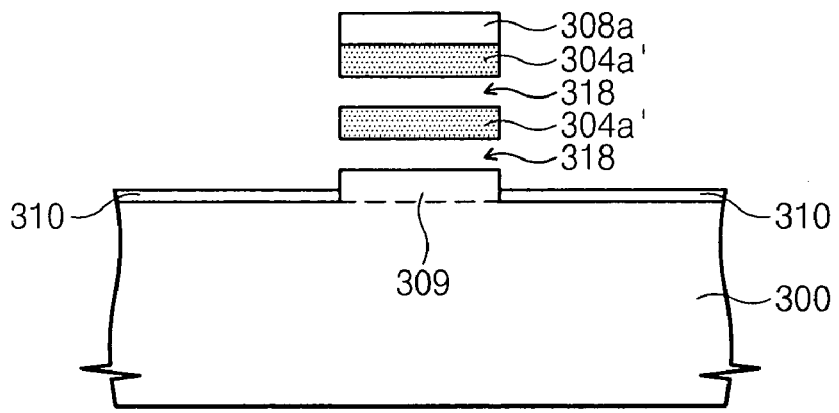

Referring to FIGS. 9A, 9B, and 9C, the exposed sacrificial pattern 302a is selectively removed to form a cavity 318, and thus, the bottom surface of the channel pattern 304a is exposed. Herein, the channel patterns 304a are spaced apart from each other upwardly and supported by the vertical pattern 312a. The channel region of the transistor includes the channel patterns 304a. The channel region also includes the bottom surface of the channel pattern 304a. In addition, the channel region may include the top surface and first surfaces of the channel pattern 304a. Furthermore, the channel region may include the top surface of the substrate protrusion 309.

The second plasma doping process is performed such that impurities are isotropically doped into the channel region. The second plasma doping process is correspondent to the channel doping process. The second plasma doping process may be performed such that the impurities are isotropically doped using the sheath electric field and/or the scattering effect. The impurities are isotropically doped through the exposed first side surfaces and bottom surface of the channel pattern 304a. As a result, the impurities in the doped channel pattern 304a' may be uniformly distributed. In the second plasma doping process, the impurities are also doped through the top surface of the substrate protrusion 309 and the exposed top surface of the channel pattern 304a. The second plasma doping process will be more fully illustrated with reference to the flowchart of FIG. 11.

Referring to FIGS. 9A, 9B, 9C, and 11, the semiconductor substrate 300 including the channel region having at least one channel pattern 304a is loaded into the process chamber (S150). The channel patterns 304a are spaced apart from each other upwardly so that the channel region has a three-dimensional structure. Herein, there is the cavity 318 between the channel patterns 304a as well as between the channel pattern 304a and the semiconductor substrate 300.

The first and second source gases in plasma state are supplied into the process chamber (S160). The first source gas of the second plasma doping process includes n-type or p-type elements, and the second source gas of the second plasma doping process includes the dilution elements. The first source gas of the second plasma doping process may be the same as the first source gas used in the first plasma doping process. The dilution element and the second source gas of the second plasma doping process may be the same as those of the first and second embodiments. Also, in the second plasma doping process, the first and second source gases may be supplied into the process chamber after converting them into plasma state. Alternatively, after supplying the first and second source gases into the process chamber, the source gases may be converted into plasma state.

The impurity and dilution ions of the source gases in plasma state are isotropically doped into the channel region having the channel pattern 304a using the sheath electric field and/or scattering effect. Therefore, the channel region having the doped channel pattern 304a' may be uniformly doped. In this case, the intensity of the sheath electric field and scattering effect may also be controlled by adjusting the amount of the dilution ions. Accordingly, the impurity concentration of the doped channel pattern 304a' satisfies the target concentration, and further the channel region having the doped channel pattern 304a' may be uniformly doped as well. In addition, even though the dose of the impurity ions for doping the channel region may be low, the detected charge may increase by increasing the amount of the dilution ions, and the amount of the impurity ions may be minutely controlled as well. Resultingly, it is possible to secure the reliability for the impurity concentration of the channel region.

It is preferable that the amount of the dilution ions should be greater than the amount of the impurity ions. For instance, the amount of the dilution ions may be a few times to thousands times greater than the amount of the impurity ions. It is preferable that the ionization ratio of the second source gas is equal to or higher than that of the first source gas.

Subsequently, the semiconductor substrate 300 is unloaded from the process chamber (S180). If the second plasma doping process employs nitrogen and/or oxygen, there may be performed the thermal process of segregating the nitrogen ore/and oxygen at the surface of the channel pattern 304a' and the removal process of the segregation layer after the second plasma doping process.

Figure 10A:
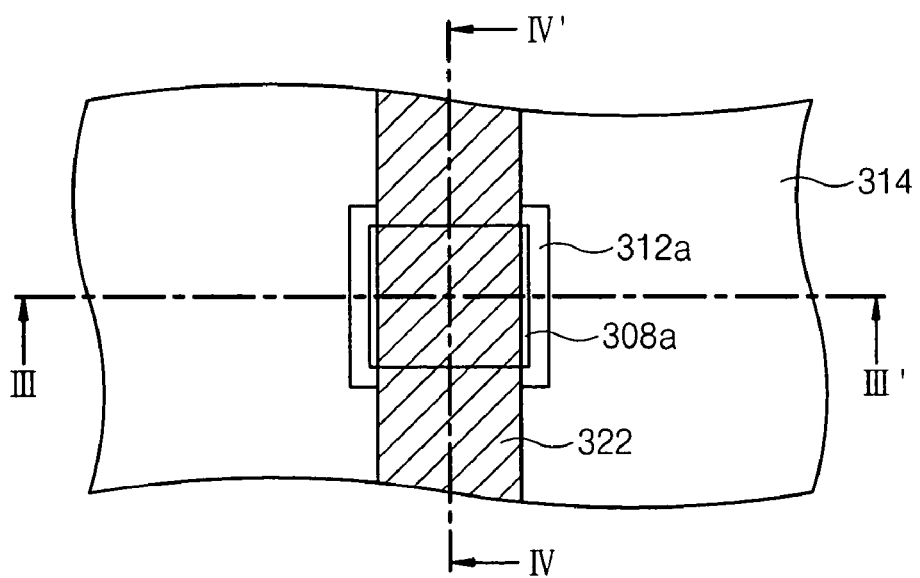
Figure 10B:
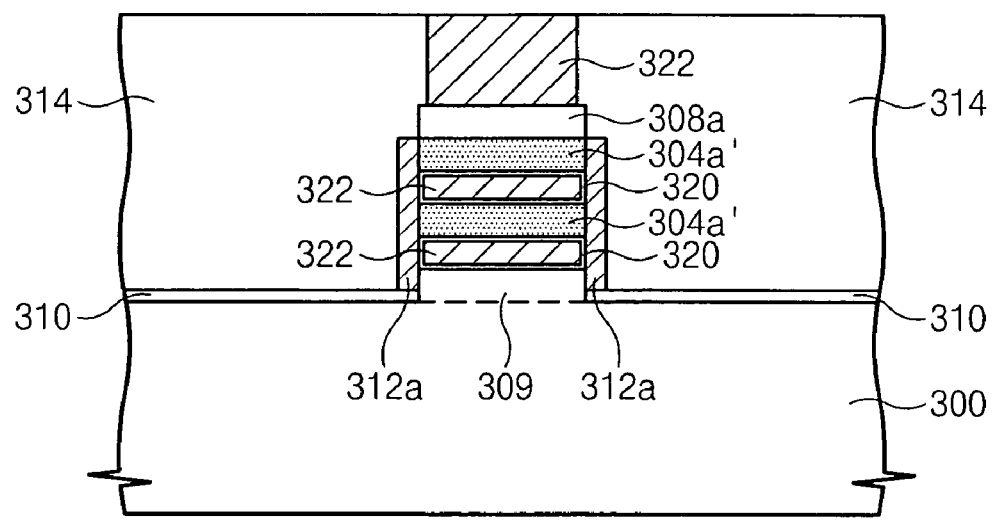
Figure 10C:
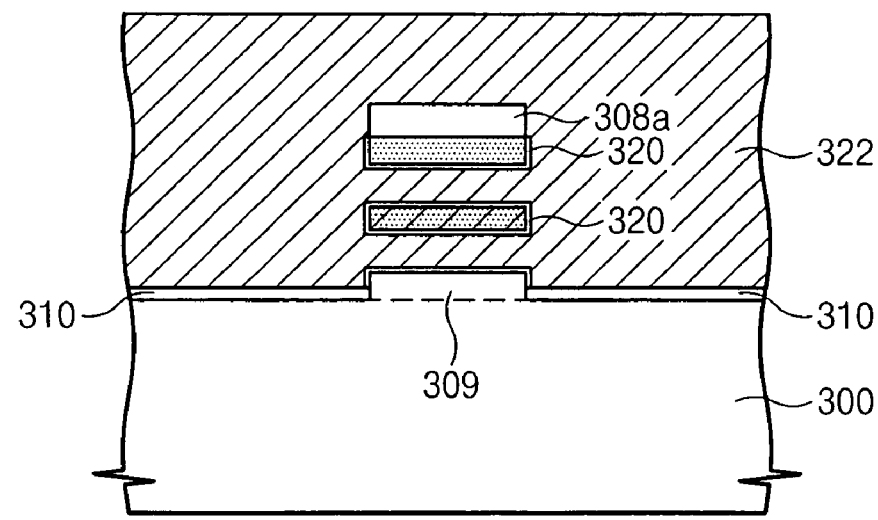

Referring to FIGS. 10A, 10B, and 10C, a gate insulating layer 320 is formed on the exposed surface of the doped channel pattern 304a', the exposed surface of the substrate protrusion 309, and the exposed surface of the vertical pattern 312a. The gate insulating layer 320 may be formed of a silicon oxide layer, e.g., particularly, a thermal oxide layer. A gate conductive layer is formed over the entire surface of the semiconductor substrate 300 including the gate insulating layer 320 such that it fills the groove 316. At the same time, the gate conductive layer also fills the cavity 318, wherein the gate insulating layer 320 is interposed between the gate conductive layer outside the cavity 318 and the gate conductive layer inside the cavity 318. The gate conductive layer may be formed of the same material as those of the first and second embodiments.

Afterwards, the gate conductive layer is planarized till the mold insulating layer 314 is exposed, to thereby form a gate electrode 322.

As described above, according to the present invention, the three-dimensional structure such as the channel region or the source/drain region is isotropically doped using the plasma doping process which employs the first and second source gases, wherein the first source gas includes the n-type or p-type impurity elements and the second source gas includes the dilution element regardless of the electrical characteristic of the doped region. Therefore, it is possible to uniformly distribute the impurity elements in the three-dimensional structure.

In particular, the degree of isotropy is controlled by controlling the sheath electric field and/or scattering effect through the control of the amount of the dilution ions. As a result, the impurity concentration of the doped region satisfies the target concentration, and the impurity elements may be uniformly distributed in the three-dimensional structure as well.

In addition, it is possible to increase the detected charge by increasing the amount of the dilution ions even though the low dose impurity ions are doped into a target region. Accordingly, it is possible to secure the reliability of the detected total charge. Furthermore, since the charge of the impurity ions is small in comparison with the detected total charge, the amount of the impurity ions may be minutely controlled. Resultingly, it is possible to secure the reliability for the concentration of the doping region with low dose.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a semiconductor device, comprising:
    forming a three-dimensional structure formed of a semiconductor on a semiconductor substrate; and
    isotropically doping the three-dimensional structure by performing a plasma doping process using a first source gas and a second source gas, wherein the first source gas includes n-type or p-type impurity elements and the second source gas includes a dilution element regardless of the electrical characteristic of a doped region, wherein the three-dimensional structure includes a channel region and the plasma doping process is performed such that impurities are doped through the channel region.

2. The method of claim 1, wherein the forming of the three-dimensional structure comprises forming a fin protruded upward over the semiconductor substrate, in which the fin includes the channel region, the fin being the three-dimensional structure.

3. The method of claim 1, wherein the forming of the three-dimensional structure comprises:
    forming a fin protruded upward over the semiconductor substrate;
    forming a gate insulating layer on the surface of the fin; and forming a gate electrode on the gate insulating layer, the gate electrode crossing over the fin, wherein the fin of both sides of the gate electrode is the three-dimensional structure.

4. The method of claim 1, wherein the forming of the three-dimensional structure comprises forming the channel region including a concavity by recessing a predetermined region of the semiconductor substrate, the channel region including the concavity being the three-dimensional structure.

5. The method of claim 1, wherein the forming of the three-dimensional structure comprises forming the channel region including at least one channel pattern spaced apart upwardly over the semiconductor substrate, the channel region being the three-dimensional structure and the plasma doping being performed such that impurities are doped through bottom and side surfaces of the channel pattern.

6. The method of claim 5, wherein the forming of the channel region comprises:
    alternately forming a sacrificial layer and a channel layer over the semiconductor substrate at least one time, wherein the sacrificial layer and the channel layer have different etch selectivity with respect to each other, the channel layer being formed of a semiconductor layer;
    patterning the channel layer and the sacrificial layer in sequence to form a sacrificial pattern and a channel pattern which are alternately stacked at least once;
    forming a pair of vertical patterns extended upward over the semiconductor substrate, wherein one pair of opposite side surfaces of the sacrificial and channel patterns contact the pair of vertical patterns, respectively, and the other pair of side surfaces of the sacrificial and channel patterns are exposed, the one pair of opposite side surfaces being perpendicular to the other pair of opposite side surfaces; and
    selectively removing the exposed sacrificial pattern.

7. The method of claim 1, wherein the forming of the three-dimensional structure comprises:
    forming the channel region including at least one channel pattern spaced apart upwardly over the semiconductor substrate; and
    forming a vertical layer formed of a semiconductor over the semiconductor substrate such that the vertical layer surrounds the side surfaces of the channel patterns, wherein the vertical layer is the three-dimensional structure, and the vertical layer includes source/drain regions.

8. The method of claim 1, wherein the doping by the isotropically plasma doping process comprises:
    loading the semiconductor substrate having the three-dimensional structure into a process chamber;
    converting the first and second source gases into a plasma state outside the process chamber;
    supplying the first and second source gases in plasma state into the process chamber;
    isotropically doping impurity ions and dilution ions of the first and second source gases in plasma state into the three-dimensional structure; and
    unloading the semiconductor substrate from the process chamber.

9. The method of claim 1, wherein the doping by the isotropic plasma doping process comprises:
    loading the semiconductor substrate having the three-dimensional structure into a process chamber;
    supplying the first and second source gases into the process chamber;
    converting the first and second source gases into a plasma state by applying a plasma energy to the process chamber;
    isotropically doping impurity ions and dilution ions of the first and second source gases in plasma state into the three-dimensional structure; and
    unloading the semiconductor substrate from the process chamber.

10. The method as in any one of claims 1-7, wherein an ionization ratio of the second source gas is equal to or higher than that of the first source gas.

11. The method of claim 1, wherein the amount of the dilution element is greater than the amount of the impurity element.

12. The method of claim 1, wherein the dilution element includes at least one selected from the group consisting of oxygen, nitrogen, germanium, carbon, fluorine, and chlorine.

13. The method of claim 12, wherein the second source gas includes at least one of oxygen and nitrogen as the dilution element, the method further comprising, after the plasma doping process:
    segregating the oxygen and/or nitrogen in the three-dimensional structure at the surface of the three-dimensional structure; and
    removing a segregated portion of the oxygen and/or nitrogen.

14. A method of forming a semiconductor device, comprising:
    forming a three-dimensional structure formed of a semiconductor on a semiconductor substrate; and
    isotropically doping the three-dimensional structure by performing a plasma doping process using a first source gas and a second source gas, wherein the first source gas includes n-type or p-type impurity elements and the second source gas includes a dilution element regardless of the electrical characteristic of a doped region,
    wherein the forming of the three-dimensional structure comprises:
        forming a fin protruded upward over the semiconductor substrate;
        forming a gate insulating layer on the surface of the fin; and
        forming a gate electrode on the gate insulating layer, the gate electrode crossing over the fin, wherein the fin of both sides of the gate electrode is the three-dimensional structure.

15. A method of forming a semiconductor device, comprising:
    forming a three-dimensional structure formed of a semiconductor on a semiconductor substrate; and
    isotropically doping the three-dimensional structure by performing a plasma doping process using a first source gas and a second source gas, wherein the first source gas includes n-type or p-type impurity elements and the second source gas includes a dilution element regardless of the electrical characteristic of a doped region,
    wherein the forming of the three-dimensional structure comprises forming a channel region including at least one channel pattern spaced apart upwardly over the semiconductor substrate, the channel region being the three-dimensional structure and the plasma doping being performed such that impurities are doped through bottom and side surfaces of the channel pattern,
    wherein the forming of the channel region comprises:
        alternately forming a sacrificial layer and a channel layer over the semiconductor substrate at least one time, wherein the sacrificial layer and the channel layer have different etch selectivity with respect to each other, the channel layer being formed of a semiconductor layer;

patterning the channel layer and the sacrificial layer in sequence to form a sacrificial pattern and a channel pattern which are alternately stacked at least once;

forming a pair of vertical patterns extended upward over the semiconductor substrate, wherein one pair of opposite side surfaces of the sacrificial and channel patterns contact the pair of vertical patterns, respectively, and the other pair of side surfaces of the sacrificial and channel patterns are exposed, the one pair of opposite side surfaces being perpendicular to the other pair of opposite side surfaces; and selectively removing the exposed sacrificial pattern.

16. A method of forming a semiconductor device, comprising:

forming a three-dimensional structure formed of a semiconductor on a semiconductor substrate; and isotropically doping the three-dimensional structure by performing a plasma doping process using a first source gas and a second source gas, wherein the first source gas includes n-type or p-type impurity elements and the second source gas includes a dilution element regardless of the electrical characteristic of a doped region, wherein the doping by the isotropically plasma doping process comprises:

loading the semiconductor substrate having the three-dimensional structure into a process chamber;

converting the first and second source gases into a plasma state outside the process chamber;

supplying the first and second source gases in plasma state into the process chamber;

isotropically doping impurity ions and dilution ions of the first and second source gases in plasma state into the three-dimensional structure; and unloading the semiconductor substrate from the process chamber.

17. A method of forming a semiconductor device, comprising:

forming a three-dimensional structure formed of a semiconductor on a semiconductor substrate; and isotropically doping the three-dimensional structure by performing a plasma doping process using a first source gas and a second source gas, wherein the first source gas includes n-type or p-type impurity elements and the second source gas includes a dilution element regardless of the electrical characteristic of a doped region, wherein the doping by the isotropic plasma doping process comprises:

loading the semiconductor substrate having the three-dimensional structure into a process chamber;

supplying the first and second source gases into the process chamber;

converting the first and second source gases into a plasma state by applying a plasma energy to the process chamber;

isotropically doping impurity ions and dilution ions of the first and second source gases in plasma state into the three-dimensional structure; and unloading the semiconductor substrate from the process chamber.

* * * * *